(12) United States Patent
Reboh et al.

(10) Patent No.: US 10,014,183 B2
(45) Date of Patent: Jul. 3, 2018

(54) METHOD FOR PATTERNING A THIN FILM

(71) Applicants: COMMISSARIAT A L'ENERGIE ATOMIQUE ET AUX ENERGIES ALTERNATIVES, Paris (FR); STMICROELECTRONICS SA, Montrouge (FR)

(72) Inventors: Shay Reboh, Sassenage (FR); Laurent Grenouillet, Grenoble (FR); Yves Morand, Grenoble (FR)

(73) Assignees: COMMISSARIAT A L'ENERGIE ATOMIQUE ET AUX ENERGIES ALTERNATIVES, Paris (FR); STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 15/523,742

(22) PCT Filed: Nov. 9, 2015

(86) PCT No.: PCT/EP2015/076078
§ 371 (c)(1),
(2) Date: May 2, 2017

(87) PCT Pub. No.: WO2016/075083
PCT Pub. Date: May 19, 2016

(65) Prior Publication Data
US 2017/0358459 A1     Dec. 14, 2017

(30) Foreign Application Priority Data
Nov. 10, 2014   (FR) ...................... 14 60849

(51) Int. Cl.
*H01L 21/308* (2006.01)
*H01L 21/311* (2006.01)
*H01L 27/12* (2006.01)

(52) U.S. Cl.
CPC .... *H01L 21/3086* (2013.01); *H01L 21/31144* (2013.01); *H01L 27/1203* (2013.01)

(58) Field of Classification Search
CPC .................. H01L 21/3086; H01L 21/31144
See application file for complete search history.

(56) References Cited

U.S. PATENT DOCUMENTS

| 4,243,433 A | * | 1/1981 | Gibbons | ........... H01L 21/26513 |
| | | | | 148/DIG. 91 |
| 8,674,470 B1 | * | 3/2014 | Or-Bach | ................. H01L 24/25 |
| | | | | 257/499 |

(Continued)

FOREIGN PATENT DOCUMENTS

JP     61-150337 A     7/1986

OTHER PUBLICATIONS

International Search Report dated Jan. 15, 2016 in PCT/EP2015/076078 filed Nov. 9, 2015.

(Continued)

*Primary Examiner* — Duy Vu N Deo
(74) *Attorney, Agent, or Firm* — Oblon, McClelland, Maier & Neustadt, L.L.P.

(57) ABSTRACT

A method for producing at least one pattern in a layer resting on a substrate, including: a) making amorphous at least one first block of an upper layer of crystalline material resting on a first amorphous supporting layer, while the crystalline structure of a second block of the upper layer that adjoins and is juxtaposed with the first block is preserved; b) partially recrystallizing the first block by using at least one side surface of the second block that is in contact with the first block as an area for the start of a recrystallization front, the partial recrystallization being carried out to preserve a region of amorphous material in the first block; c) selectively etching the amorphous material of the upper layer (Continued)

with respect to the crystalline material of the upper layer to form at least one first pattern in the upper layer.

17 Claims, 8 Drawing Sheets

(56) References Cited

U.S. PATENT DOCUMENTS

| | | |
|---|---|---|
| 2013/0026607 A1 | 1/2013 | Moroz et al. |
| 2014/0264347 A1* | 9/2014 | Sassiat .............. H01L 29/78642 257/57 |
| 2015/0295021 A1 | 10/2015 | Moroz et al. |

OTHER PUBLICATIONS

French Search Report dated Jul. 6, 2015 in FR 1460849 fled Nov. 10, 2014.

Horiuchi, Masatada et al., "Lateral SPE Recovery of Implanted Source/Drain in Thin SOI MOSFETs," Ion Implantation Technology Proceedings, 1998 International Conference on Kyoto, Japan, IEEE, vol. 1, Jun. 1998, XP010361879, pp. 14-17.

Mio, A. M. et al., "Maskless implants of 20 keV $Ga^+$ in thin crystalline silicon on insulator," Journal of Applied Physics, American Institute of Physics, US, vol. 113, No. 4, Jan. 2013, XP012169763, pp. 044315-1 to 044315-7.

Tate, T.J. et al., "Amorphization and crystalline regrowth of $GdBa_2Cu_3O_7$ thin films by ion implantation and RTA," Surface and Coatings Technology Elsevier Switzerland, vol. 83, No. 1-3, Sep. 1996, XP002741703, pp. 124-127.

Seo, Jin-Wook et al., "Lateral Solid Phase Recrystallization from the Crystal Seed in Ge-Ion-Implanted Amorphous Silicon Films by Repetition Rapid Thermal Annealing," Japanese Journal of Applied Physics, Japan Society of Applied Physics, JP, vol. 40, No. 4A, Part 01, Apr. 2001, XP001081039, pp. 2150-2154.

\* cited by examiner

METHOD FOR PATTERNING A THIN FILM

TECHNICAL FIELD AND PRIOR ART

This invention relates to the field of patterning a thin layer, in particular a thin semiconductor layer for the manufacture of semiconductor devices.

In microelectronics, photolithography methods are routinely used to produce patterns having a minimum dimension (excluding thickness) that depends on the wavelengths of the radiation used.

EUV (Extreme Ultra-Violet) lithographic techniques using UV radiation with a wavelength of about 10 to 15 nanometers have in particular been developed to produce patterns with very low minimum dimensions, typically less than 30 nm.

We are therefore approaching the limits regarding the wavelengths that can be used by photolithography and therefore the minimum dimensions of the patterns that can be produced in this manner.

In order to further reduce the size of the patterns, non-optical lithographic methods can additionally be used.

However, these methods do not generally allow patterns to be defined with sufficient precision.

Document US 2013/0026607 A1 presents a method for patterning a thin layer in which material made amorphous is selectively etched with regard to the material whose crystalline structure has been preserved.

It poses the problem of finding a new method allowing for the precise definition of one or more patterns in a thin layer, in particular in a semiconductor layer or in a layer located beneath a semiconductor layer, and that is capable of producing very small patterns, typically of about 20 nm, 10 nm or less.

DESCRIPTION OF THE INVENTION

According to one aspect, this invention relates to a method for producing at least one pattern in a layer lying on a substrate, and including the steps of:
  making amorphous at least one first block of a layer referred to as an upper layer having a crystalline material base lying on a first layer of the substrate, the first layer being amorphous, while the crystalline structure of a second block of the upper layer that adjoins and is juxtaposed with said first block is preserved,
  partially recrystallising the first block by using at least one side surface of the second block that is in contact with the first block as an area for the start of a recrystallisation front, the partial recrystallisation being carried out so as to preserve a region of amorphous material in the first block,
  selectively etching the amorphous material of the upper layer with respect to the crystalline material of the upper layer.

One embodiment of this invention relates to a method for producing at least one pattern in a layer lying on a substrate, and including the steps of:
  a) performing at least one ion implantation so as to make amorphous at least one first block of a layer of crystalline material, referred to as an "upper layer", while a second block of the upper layer is protected by a first implantation mask, the crystalline structure of the second block of the upper layer that adjoins and is juxtaposed with said first block being preserved, the upper layer lying on a first supporting layer made of an amorphous material, said amorphous material allowing for selective etching with respect to the amorphous phase of the crystalline material,
  b) partially recrystallising the first block by heat treatment, by using at least one side surface of the second block that is in contact with the first block as an area for the start of a recrystallisation front, the partial recrystallisation being carried out so as to preserve a region of amorphous material in the first block and by keeping the first supporting layer amorphous,
  c) selectively etching the amorphous material of the upper layer with respect to the crystalline material of the upper layer in order to form at least one first pattern in the upper layer, the region of etched amorphous material forming a hole through the upper layer, this hole having a reduced critical dimension with respect to the critical dimension of the first mask.

In this manner, at least one first pattern may be formed in the upper layer.

The etching carried out in step c) is preferably also selective with respect to the amorphous material of the first layer.

The upper layer is advantageously a layer of semiconductor material.

Step a) may be carried out by ion implantation, during which the second block is protected by a first ion implantation mask.

By performing recrystallisation on a layer of the substrate having an amorphous material base and by using a side surface of a crystalline block, the scope of recrystallised portions of the upper layer can be controlled, and in particular that of a recrystallised portion of the first block. The size of the region having a crystalline material base can therefore be controlled with respect to that made of amorphous material.

A pattern may thus be formed having a defined dimension in the upper layer.

Moreover, using such a method, the size of the first pattern advantageously depends on the extent of propagation of the recrystallisation front in step b) and is not necessarily linked to that of the patterns of the first mask.

Recrystallisation may take place by thermal annealing. In such a case, the extent of propagation of the recrystallisation front and the scope that one is looking to obtain for the one or more recrystallisation regions is adjusted by controlling the annealing temperature and duration.

According to one possible implementation of the method, the upper layer in which is formed the one or more first patterns may be a semiconductor surface layer of a substrate of a semi-conductor on insulator type, for example an SOI (Silicon on Insulator) or GeOI (Germanium On Insulator) or SGOI (Silicon Germanium On Insulator) type. In such a case, the first supporting layer is the insulating layer of the substrate and lies on a second supporting layer which is semiconductor.

According to a first possible implementation, for which step c) is carried out such that, at the end of this etching, the second block and a recrystallised portion of the first block are preserved, while an area of the first implantation mask is preserved on the second block, the method may further include, after step c), the steps of:
  forming a second mask, the second mask being an implantation mask, the second mask filling the hole and complementing the first mask, the second mask covering at least the recrystallised portion of the first block,
  removing the first implantation mask so as to reveal the second block, making the second block amorphous while preserving the crystalline structure of the material of said recrystallised portion of the first block.

When step a) is carried out by ion implantation, through one or more apertures in the first mask, and when step c) is an etching of amorphous material to form one or more holes in the upper layer, advantageously, the second implantation mask is made so as to fill at least one aperture made in the first mask and at least one hole formed in the upper layer.

According to this first possible implementation of the method, after implantation of the second block, a step may be carried out, consisting in selectively etching the amorphous material with respect to the crystalline material of the upper layer, so as to remove the second block and form at least one second pattern in the upper layer.

This etching is preferably also selective with respect to the amorphous material of the first supporting layer.

The second pattern is advantageously smaller in size compared to the first pattern.

Patterns may thus be formed in a layer of crystalline material having a critical dimension that is smaller than that of patterns traditionally produced by photolithography. The critical dimension of an element is understood herein as being the smallest dimension of said element excluding its thickness.

The method may further include a step of removing the second mask.

According to a second possible implementation of the method, after implantation of the second block, steps may alternatively be performed for:
 partially recrystallising the second block by using at least one side surface of a crystalline portion of the first block as an area for the start of a recrystallisation front,
 selectively removing the amorphous semiconductor material with respect to the crystalline semiconductor material, so as to form at least one other pattern in the semiconductor layer having a smaller size compared to the first pattern.

The method may further include a step of removing the second mask.

The method may also be used to pattern a layer located beneath the upper layer.

Therefore, alternatively to the second possible implementation, after having removed the second mask, a step may be performed for reproducing said other pattern in the first supporting layer.

A step may further be performed for reproducing said other pattern in the second supporting layer.

According to a third possible implementation, the method can further include, after step c), the steps of:
 removing the first mask,
 reproducing said first pattern in the first supporting layer.

The method may further include a step of reproducing said first pattern in the second supporting layer.

According to a fourth possible implementation, the method may further include the steps of:
 filling the hole using at least one given material,
 selectively etching the upper layer with respect to the given material.

Therefore, the hole filled with the given material forms a pattern, the size of which depends on that of the hole, the size of the hole itself being dependent on that of the one or more preserved amorphous regions after recrystallisation in step b), which can advantageously be less than that of patterns traditionally produced by photolithography.

The hole filled with the given material can form an area of an etching mask.

In such a case, this fourth possible implementation of the method may advantageously be used to produce patterns of an etching mask having a size that is less than that of patterns traditionally produced by photolithography.

The method may further comprise a step of reproducing the given pattern of the etching mask in the first supporting layer or in a second supporting layer located beneath the first supporting layer.

The method may include, in step a), an ion implantation through at least one aperture in a mask in the shape of a frame or a geometric shape such as a circle or rectangle, so as to form a first amorphous block having a first geometry, the partial recrystallisation being carried out so as to preserve a region of amorphous material having a similar geometry but different dimension in the first block.

According to one possible implementation of the method wherein step c) is a selective etching of the amorphous material with respect to the crystalline material and results in the formation of at least one hole through the upper layer, the method may further comprise one or more steps of reproducing the hole in the first supporting layer, or in the first supporting layer and a second supporting layer on which the first supporting layer is lying.

BRIEF DESCRIPTION OF THE FIGURES

This invention will be better understood after reading the following description of embodiments, given for purposes of illustration only and not intended to limit the scope of the invention, and with reference to the accompanying figures, wherein.

Identical, similar or equivalent parts in the different figures carry the same numerical references in order to ease the passage from one figure to another.

The different parts shown in the figures are not necessarily displayed according to a uniform scale in order to make the figures easier to read.

Moreover, in the description below, the terms that depend on the orientation of the structure, such as "lateral", "upper", "lower", "under" and "on" apply while taking the structure to be oriented in the manner illustrated in the figures.

DETAILED DESCRIPTION OF THE SPECIFIC EMBODIMENTS

A first example method for producing one or more patterns in a thin layer will now be described with reference to FIGS. 1A-1E.

The layer referred to as the "upper" layer in which the one or more patterns are formed is a layer comprising a crystalline material base, which can, for example, be made from sapphire, quartz or even a semiconductor material such as silicon, germanium, diamond, SiC, SiGe, or a III-V material such as GaAs, GaN or INP. This upper layer lies on a supporting layer having an amorphous material base and allowing for selective etching with respect to the amorphous phase of the crystalline material of the upper layer. This amorphous material can, for example, be dielectric.

Figure 1A:
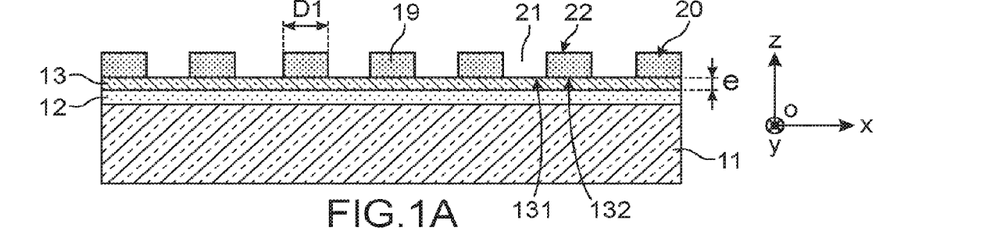
FIGS. 1A-1E illustrate a first example method for producing first patterns in a crystalline semiconductor layer using the steps of amorphisation, recrystallisation, then selective etching of regions of amorphous semiconductor material with respect to regions having a crystalline semiconductor material base.

The upper layer can be as illustrated in FIG. 1A, a surface layer 13 of a substrate of the type semi-conductor on insulator, for example of the type SOI (Silicon on Insulator), the supporting layer having an amorphous material base being the insulating layer 12 of the substrate often referred to as the BOX (Buried Oxide) layer, itself positioned on a second supporting layer 11 having a semiconductor material base.

The semiconductor surface layer 13 can have a thickness e (measured in a direction z of an orthogonal coordinate system [O; x; y; z] in FIG. 1A, and orthogonal to the plane of the substrate) for example between 5 nm and 150 nm.

An implantation mask 20 is firstly produced, having a base containing a material 19 (FIG. 1A). One or more first blocks 131 of the semiconductor surface layer 13 are respectively revealed by one or more apertures 21 in the mask 20 while areas 22 of the mask are distributed on one or more second blocks 132 of the semiconductor surface layer 13 juxtaposed with the first blocks 131. The areas 22 of the mask 20 can have a critical dimension $D_1$ (corresponding to the smallest dimension in the plane of the substrate [O; x; y]; in the example in FIG. 1A, this is the dimension along x), for example between 20 nm and 1 µm. This mask 20 is produced using standard lithographic means. The material 19 of the mask is chosen so that it does not allow species subsequently implanted to reach the underlying layer 12. The material 19 of the mask 20 is also chosen so that it can also be subsequently used as an etching mask. The material 19 can be, for example, silicon nitride (of the general formula $Si_xN_y$) or silicon oxide (of the general formula $SiO_x$).

Ion implantation is then carried out (FIG. 1B) through the one or more apertures 21 in the mask 20, so as to make the one or more first blocks 131 of the semiconductor surface layer 13 amorphous, while the one or more second blocks 132 protected by the mask 20 are not implanted and thus retain their crystalline structure. The ion implantation process can be a "standard" implantation process, wherein ions are transported in a beam, or can be an implantation process that uses plasma immersion techniques.

Figure 1B:
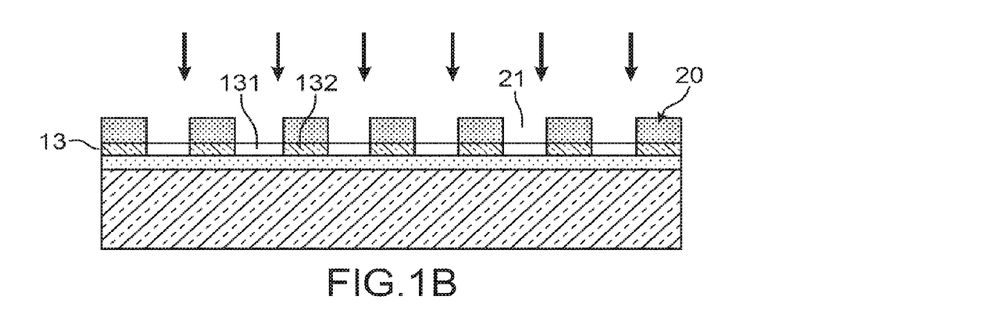

In the example in FIG. 1B, the first blocks 131 are made amorphous throughout their thickness e, that is to say as far as the insulating layer 12 of the substrate.

The amorphising implantation can take place, for example, with Ge, or Si, or As, or C, or Ar, or P or N atoms, at an energy chosen to suit the nature of the implanted species, the nature and thickness of the surface layer 13, the implantation current density and the temperature of the substrate during implantation.

The implantation energy can be, for example, between 3 keV and 40 keV, and the implantation dose is, for example, between $10^{14}$ and $5 \times 10^{15}$ atoms/cm² implanted at a current of 6 mA in equipment that controls the temperature of the substrate at 20° C.

For example, in order to amorphise a thickness of 15 nm of Si, Si ions can be implanted at an energy of between 6 keV and 8 keV with a dose of between $4 \times 10^{14}$ and $1 \times 10^{15}$ atoms/cm².

In order to make a thickness of 30 nm of Si amorphous, Si ions can, for example, be implanted at an energy of between 14 keV and 25 keV at a dose of about $5 \times 10^{14}$ atoms/cm².

Figure 1C:
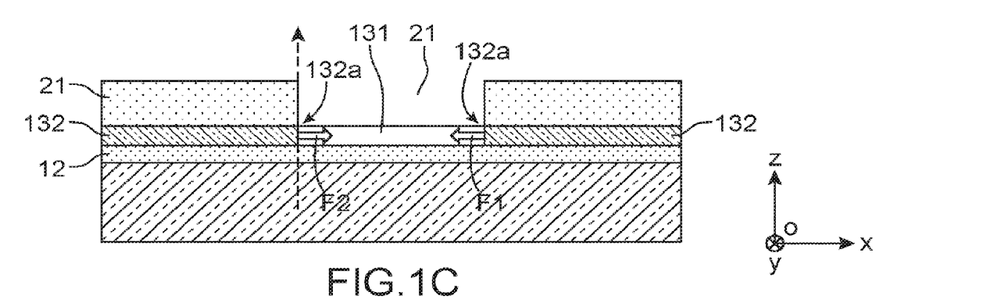

Then (FIG. 1C showing an enlarged view compared to FIG. 1B), at least a first block 131 that has been made amorphous is partially recrystallised, by using at least one side surface 132a of a second adjacent block 132 that adjoins and is juxtaposed with the first block 131, as an area for the start of a recrystallisation front, the crystalline structure of said second block being preserved during the implantation. Partial recrystallisation is understood herein as the preservation of at least one amorphous region in the surface layer 13.

"Side surface" is understood herein as being a surface that is not parallel to the principal plane of the substrate (the principal plane of the substrate being defined here and in the entire description as a plane passing through the substrate and parallel to the plane [O, x, y] given in FIG. 1C), and thus produces a non-zero angle with the principal plane of the substrate. In the example in FIG. 1C, the side surface 132a extends orthogonally to the principal plane of the substrate, along the z direction of the orthogonal coordinate system [O, x, y, z].

Each first block 131 made amorphous can be adjoined to several crystalline blocks 132, or even have its entire periphery surrounded by crystalline blocks, such that multiple recrystallisation fronts (shown using arrows F1 and F2 in FIG. 1C) propagate in this first block 131.

Seed crystals therefore grow laterally from the periphery of the first block 131 towards its centre, the recrystallisation fronts moving horizontally, i.e. parallel to the principal plane of the substrate and to the insulating layer 11.

The fact that the supporting layer 12 on which lies the first block 131 is itself amorphous prevents recrystallisation from being initiated vertically from the supporting layer, thus enabling the central part of the first block 131 made amorphous, located between the recrystallisation fronts, to remain amorphous. It is also important that this supporting layer 12 is not itself recrystallised during the recrystallisation annealing of the first block 131. The material of this supporting layer 12 and the conditions (in particular the temperature) of the annealing are chosen accordingly.

In order to carry out this recrystallisation, annealing takes place at a temperature T that is sufficient to obtain this recrystallisation from lateral crystals (solid phase epitaxial regrowth: SPER in English), however that is less than the temperature causing the crystals to be randomly nucleated in the amorphous part (where Tsper≤T<Trandom nucleation of crystals in the amorphous part).

In the case of silicon, this temperature can be between, for example, 480° C. and 1,100° C., and last a duration that is, for example, between 1 s and 10 h. Advantageously, this annealing takes place between 580° C. and 650° C. in order to limit the number of defects in the recrystallised part. At a given temperature, the annealing time is adjusted to control the dimension of the area recrystallised laterally from the side surface 132*a* at the level of which the recrystallisation front was started (along the propagation direction of the recrystallisation front). The dimensions in the plane of the substrate of a residual amorphous area 1311 are thus controlled. The lower the recrystallisation temperature, the slower the recrystallisation speed.

Figure 1D:
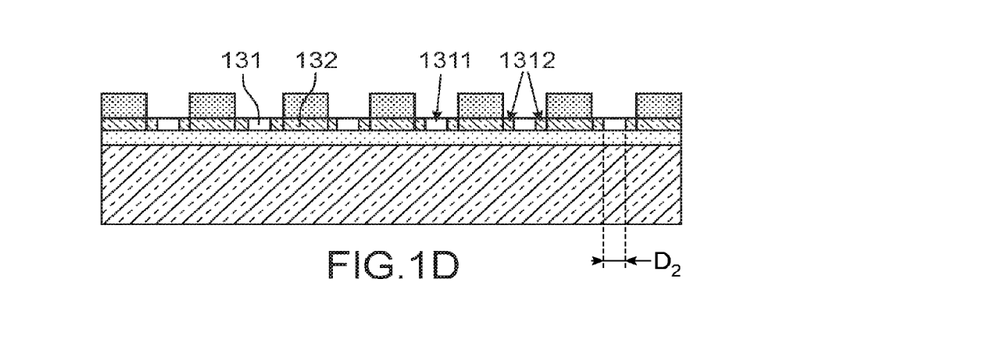

At the end of this partial recrystallisation process, a semiconductor surface layer 13 can be obtained, said layer comprising one or more regions of crystalline semiconductor material formed from the second blocks 132 that are adjoined to one or more recrystallised portions 1312 of the first blocks 131. The semiconductor surface layer 13 further comprises residual regions 1311 of the first blocks 131 that have remained amorphous (FIG. 1D).

Figure 1E:
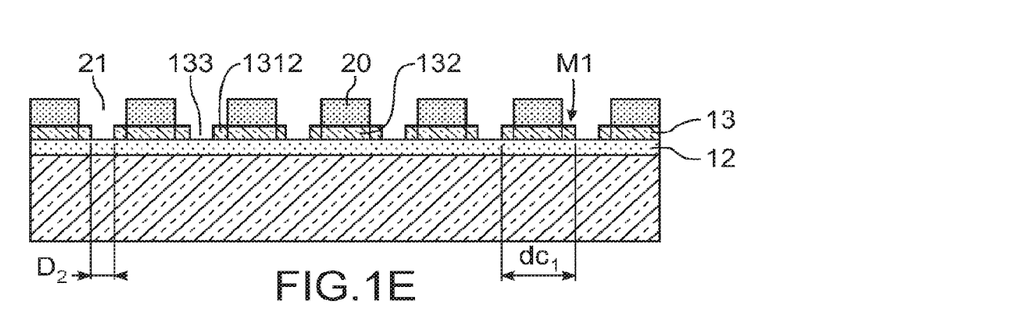

The amorphous regions 1311 are then selectively etched with respect to the crystalline semiconductor material (FIG. 1E). This etching is preferably also selective with respect to the material of the supporting layer 12. This selective etching can be performed, for example, with HCl in its gaseous phase at a temperature that can be between, for example, 400° C. and 800° C. when the surface layer 13 has an Si, or SiGe, or Ge base and the layer 12 has an $SiO_2$ base.

After this etching process, one or more regions of crystalline semiconductor material are preserved, forming first patterns $M_1$ of a smaller dimension (excluding the thickness), referred to as the critical dimension $dc_1$, defined in a precise manner in the semiconductor layer 13. The etched regions of the semiconductor layer form holes 133 revealing the insulating supporting layer 12. These holes 133 have a critical dimension $D_2$ that is reduced compared to the dimensions of the mask 20 and can therefore be a dimension that is less than that which can be obtained using a standard lithographic method. These holes 133, as shown hereinbelow (in particular with reference to the embodiments illustrated in FIGS. 4A to 4C and 5A to 5D) can be used to produce holes or patterns having small dimensions ($D_2$).

The implantation mask 20 can then be removed, for example by chemical etching with hydrofluoric acid in the case of a hard silicon oxide mask. Plasma-based etching processes can also be used, such as RIE, for example containing $CHF_3$ to etch silicon oxide.

According to an alternative embodiment (FIGS. 1F to 1J), patterns can be obtained that have a reduced size compared to the size of the first patterns $M_1$.

To do this, according to an alternative manner, the implantation mask 20 can be kept after producing the holes 133.

A filler material 39 is then deposited (FIG. 1F), filling the apertures 21 of the mask 20 and the holes 133 made in the semiconductor surface layer. The filler material 39 is in particular chosen so as to be able to withstand selective etching of the material of the implantation mask 20. The deposited material 39 can, for example, be silicon nitride (of the general formula $Si_xN_y$). The material 39 is also chosen so as to be able to form by filling the apertures 21 and the holes 133.

Figure 1F:
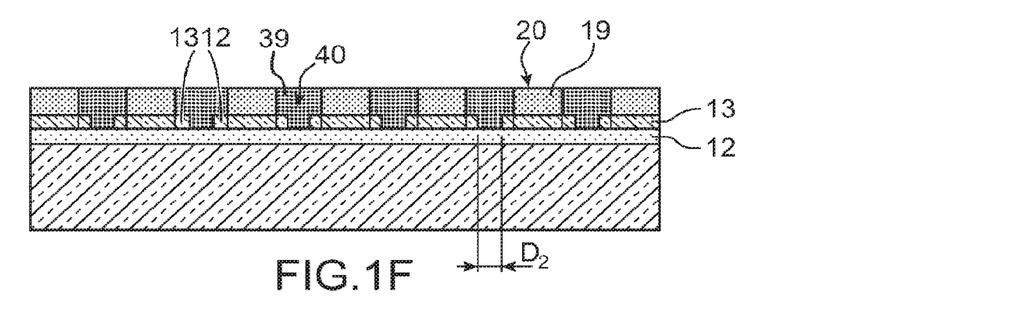
FIGS. 1F-1J illustrate an example method for reducing the first semiconductor patterns produced using the first example method, and for obtaining patterns with a size that can be less than that traditionally obtained by photolithography.

A planarising or polishing step is then performed, for example CMP (chemical mechanical planarisation) so as to place the filler material 39 and the first mask 20 at the same level.

The second implantation mask 40 thus formed covers the recrystallised portions 1312 of the first blocks 131, and comprises patterns having a critical dimension $D_2$ corresponding to the critical dimension of the holes 133 formed in the semiconductor layer 13, and such that $D_2$ is less than the critical dimension $D_1$ of the patterns of the first mask 20.

Figure 1G:
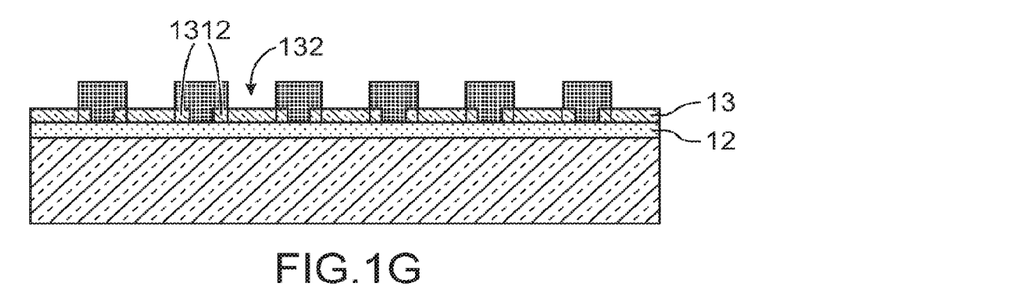
Figure 1H:
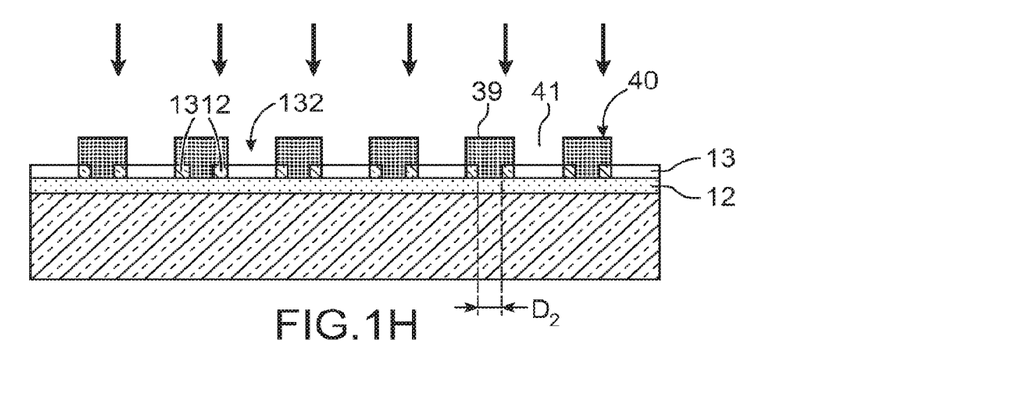

The first implantation mask 20 is then removed (FIG. 1G). This removal can take place by selectively etching the material 19 with respect to the material 39 forming the second implantation mask 40. In the case, for example, where the material 19 of the mask 20 is $SiO_2$ and the material 39 of the second mask 40 is SiN, this selective etching can be performed, for example, with hydrofluoric acid. After this removal, the one or more second blocks 132 of the semiconductor layer 13, the crystalline structure of which has been preserved, are revealed and are not protected by the second mask 40.

The second blocks 132 are then amorphised by implantation through the apertures 41 of the second mask 40 (FIG. 1H), while the recrystallised portions 1312 are protected by the second mask 40.

The amorphous material of the blocks 132 is then selectively etched (FIG. 1I) with respect to the crystalline material so as to remove the one or more second blocks 132 of the semiconductor layer. This etching is preferably also selective with respect to the material of the supporting layer 12.

Figure 1I:
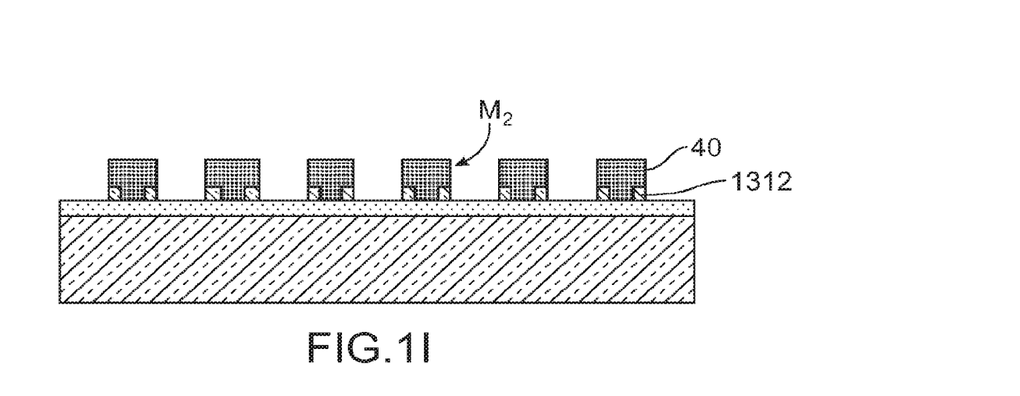

After this removal, the respective portions 1312 of the blocks 131 that have been recrystallised form second patterns $M_2$ having a critical dimension $dc_2$ that can be, for example, between 2 nm and 25 nm and that is less than the critical dimensions $D_1$ of the first mask 20 and $D_2$ of the second mask 40 (obtained using standard lithographic methods).

Figures 1J, 2A:
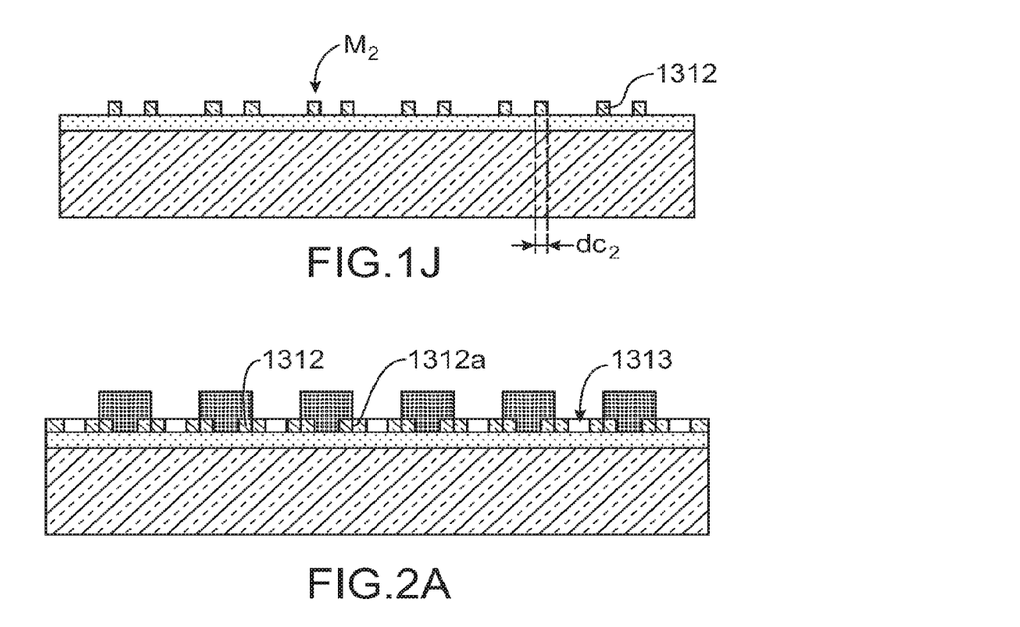
FIGS. 2A-2C illustrate one alternative to the method allowing for the formation of semiconductor patterns of reduced size.

The second implantation mask 40 can then be removed (FIG. 1J). This removal can take place, for example, using hot orthophosphoric acid when the material 40 is silicon nitride.

The portions 1312 of crystalline semiconductor material formed in the semiconductor layer 13 can be, for example, in the form of semiconductor bars intended, for example, to produce areas of transistor channels, in particular of the FinFET type.

Figure 2B:
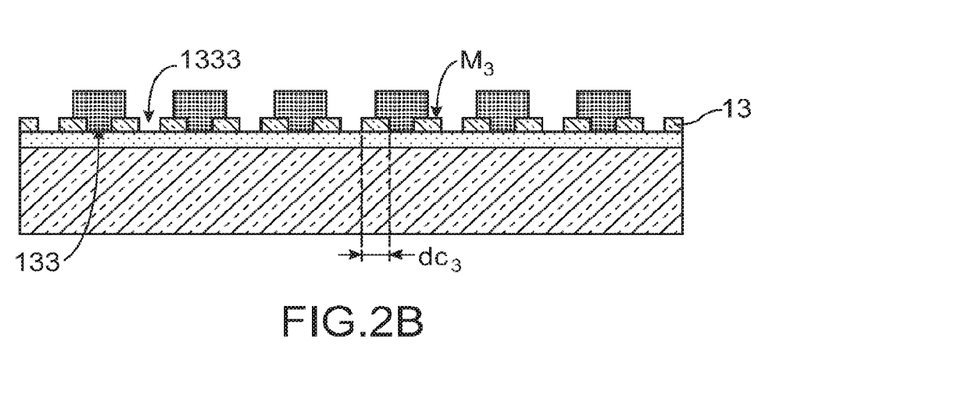
Figure 2C:
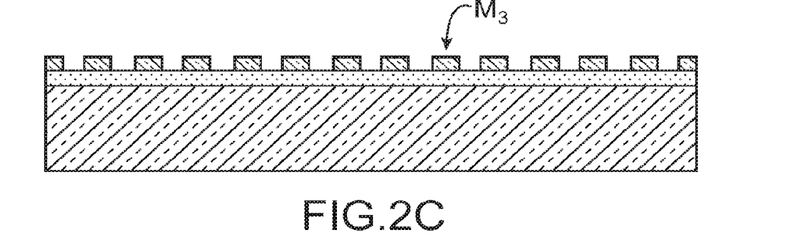

Another alternative method for reducing the first patterns $M_1$ made in the semiconductor layer 13 is illustrated in FIGS. 2A-2C.

According to this alternative, after the amorphisation step by implantation through the apertures 41 of the second mask 40 (described hereinabove with reference to FIG. 1H), the second blocks 132 can be partially recrystallised, by using the side walls 1312*a* of the recrystallised portions 1312 of the first blocks 131 as an area for the start of recrystallisation fronts (FIG. 2A).

Amorphous regions 1313 of the semiconductor layer 13 are then selectively etched with respect to the regions of crystalline material and the supporting layer 12. This etching is preferably also selective with respect to the material of the supporting layer 12.

The amorphous portions of the second blocks 132 are thus removed to form holes 1333 (FIG. 2B). The regions of crystalline semiconductor material that have been preserved thus form patterns $M_3$ in the semiconductor surface layer 13 having a critical dimension $dc_3$ that is reduced compared to the critical dimension $dc_1$ of the patterns $M_1$. Moreover, the holes 1333 and 133 have respective critical dimensions that are less than those that could be obtained using standard lithographic methods, as well as a greater density, said density capable of being double that of the apertures in the initial mask 20. The holes 133 and 1333 can in particular have a dimension that is less than 30 nm, for example between 5 nm and 10 nm.

The second implantation mask 40 can then be removed (FIG. 2C).

Alternatively to either of the example methods described hereinabove, the one or more patterns formed in the semiconductor layer 13 can then be reproduced in an underlying layer of the latter, located in the substrate on which lies the semiconductor layer 13. As shown hereinbelow, the holes formed in the semiconductor layer 13 can also be reproduced.

Figure 3A:
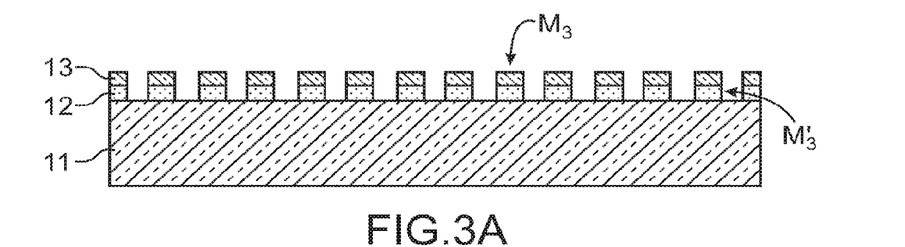
FIGS. 3A-3C illustrate an example method wherein the semiconductor patterns formed using the method according to FIGS. 2A-2C is reproduced in one or more underlying layers.
Figure 3B:
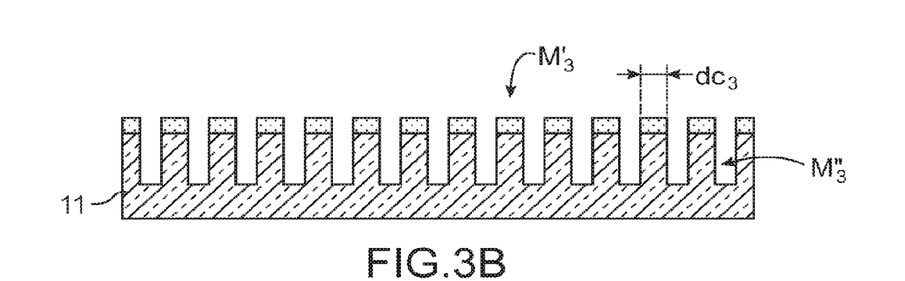
Figure 3C:
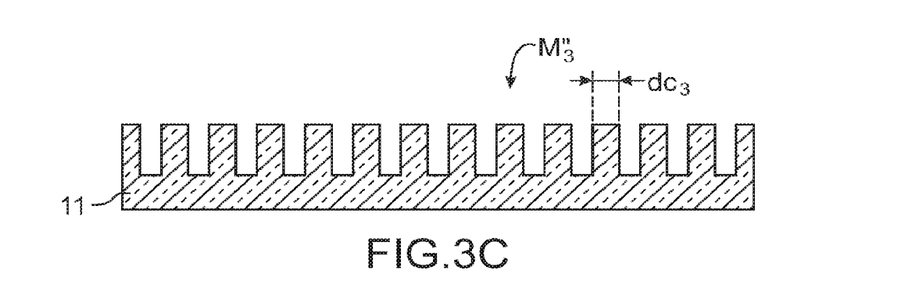

A transfer of the patterns $M_3$ formed in the semiconductor layer 13 using a method as described hereinabove with reference to FIGS. 2A-2C is illustrated in FIGS. 3A-3C. This step can be carried out after the step illustrated with reference to FIG. 1J.

To do this, the supporting insulating layer 12 is firstly etched (FIG. 3A) by using the regions of crystalline material as an etching mask. This etching can take place, for example by RIE reactive-ion etching, for example using $CHF_3$ if etching silicon oxide. It enables patterns $M'_3$ to be formed in this layer 12 reproducing the patterns $M_3$.

The supporting semiconductor layer 11 can then be etched (FIG. 3B), by using the regions of crystalline material $M_3$ as an etching mask if selective etching exists between the crystalline material of the layer 13 and the material of the supporting layer 11. In order to etch the supporting layer 11, patterns $M'_3$ made in the insulating layer 12 can alternatively be used as an etching mask if selectivity exists between the material of the insulating layer 12 and that of the supporting layer 11.

The patterns $M'_3$, $M''_3$ made thus have a critical dimension $dc_3$ corresponding to that of the patterns $M_3$ previously formed by the removal of amorphous regions of the semiconductor layer.

The patterns $M'_3$ can then potentially be removed from the insulating layer 12 (FIG. 3C).

The patterns $M''_3$ can be in the form of semiconductor bars intended, for example, to produce areas of transistor channels, in particular of the FinFET type.

Alternatively, the patterns $M''_3$ can be implemented to manufacture a photonic device and be intended to form, for example, diffraction gratings or mirrors, in particular of the type "Distributed Bragg Reflectors" (DBR) or "Distributed Feedback" (DFB), or even, for example, light-emitting pillars.

According to another alternative, the patterns $M''_3$ can form patterns of an embossing mould intended to be used in a lithographic method according to a technique known as "nano-imprint".

According to another alternative, the structure in FIG. 3C can be intended to form an assembly of channels for a fluidic device.

Figure 4A:
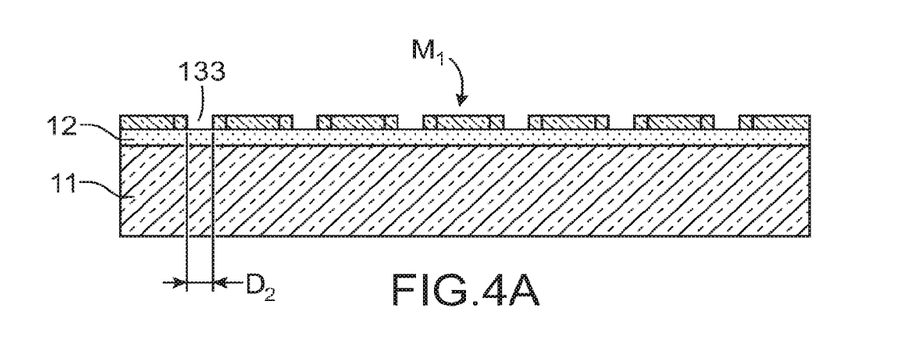
FIGS. 4A-4C illustrate an example method wherein the semiconductor patterns formed using the method according to FIGS. 1A-1E are reproduced in one or more underlying layers in order to form, within said underlying layers, patterns having a size that can be less than that traditionally obtained by photolithography.
Figure 4B:
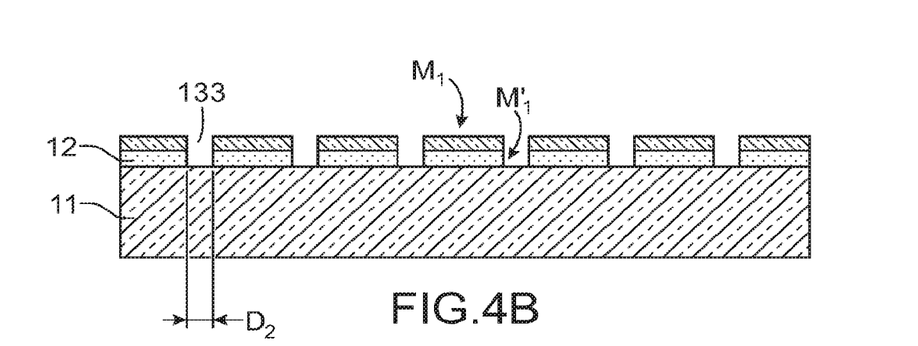
Figure 4C:
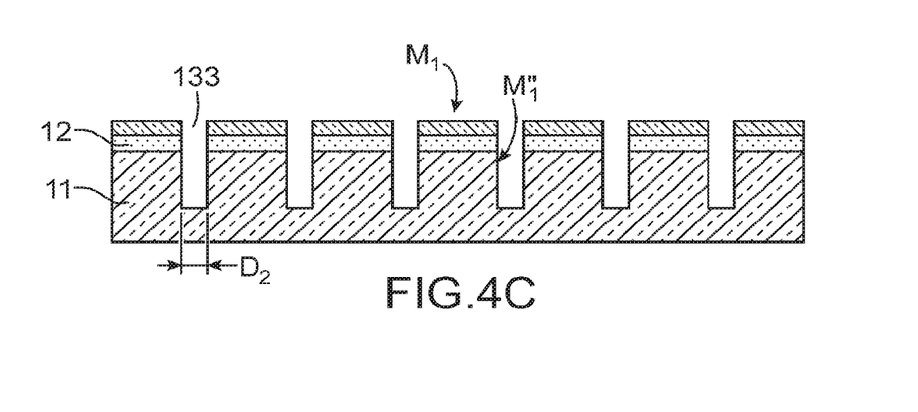

A transfer in an underlying layer of holes 133 having a low critical dimension from the mask formed from the first patterns $M_1$ made in the semiconductor layer 13 using a method as described hereinabove with reference to FIGS. 2A-2C is illustrated in FIGS. 4A-4C.

In order to perform said transfer, after the step of forming the holes 133 described hereinabove with reference to FIG. 1E, the first implantation mask 20 can be removed (FIG. 4A), for example by etching using hot orthophosphoric acid (for example heated to about 185° C.) when said mask has an SiN base.

Areas of the supporting insulating layer 12 located at the bottom of the holes 133 can then be removed (FIG. 4B). The holes 133 in the supporting insulating layer 12 are thus extended. The patterns $M_1$ made in the semiconductor layer 13 can thus be reproduced in the insulating layer 12, and similar patterns $M'_1$ can be formed in the insulating layer 12. This removal can take place, for example, by RIE reactive-ion etching, for example using $CHF_3$ if the insulating layer 12 is made from silicon oxide, by using regions of crystalline material formed from the recrystallised portions 1312 and the second blocks 132, the crystalline structure of which has been preserved, as an etching mask. The holes 133 in the second semiconductor supporting layer 11 can then be extended (FIG. 4C).

This removal can take place, for example, by etching by reactive-ion etching (RIE), for example using a chlorinated gas such as $BCl_3$ or $SiCl_4$. Patterns $M''_1$ in the second supporting layer 11 can thus be formed, reproducing the patterns $M_1$ made in the semiconductor layer 13 or those $M'_1$ formed in the insulating layer 12.

The holes 133 can be intended to form electrical insulation, for example STI (Shallow Trench Isolation).

Alternatively, the pattern holes 133 can be intended to form channels for a fluidic device.

According to another alternative, the structure illustrated in FIG. 4C can be intended to form an embossing mould for nano-imprint lithography.

In another example embodiment, illustrated in FIGS. 5A-5D, the purpose is not to obtain small holes as in the previous example, but small protruding elements.

Figure 5A:
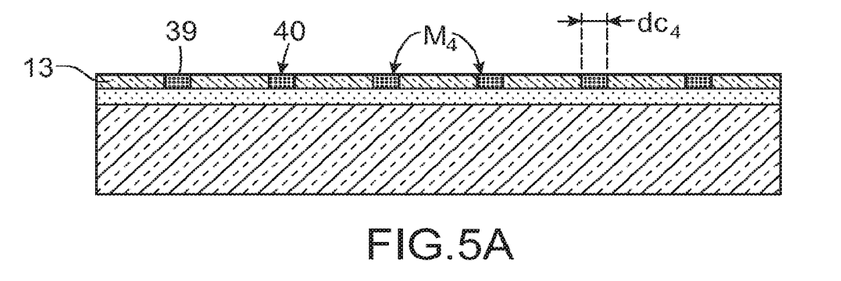
FIGS. 5A-5D illustrate an example method wherein an etching mask is formed, said etching mask comprising patterns having a size that can be less than that traditionally obtained by photolithography.

For this alternative embodiment, after performing the step of removing the first implantation mask 20 described hereinabove with reference to FIG. 1G, a thickness of the second implantation mask 40 can be removed, so as to only retain the material 39 of the second mask 40 that is located in the holes 133. This removal can take place by CMP, and so as to reach the upper surface of the semiconductor surface layer 13 and place the material 39 at the same level as the semiconductor surface layer 13 (FIG. 5A).

After this removal, the mask 40 comprises patterns $M_4$ having a critical dimension $dc_4$ corresponding to that of the holes 133.

Figure 5B:
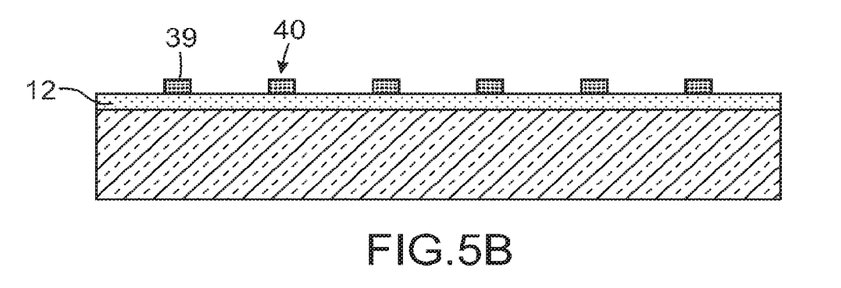
Figure 5C:
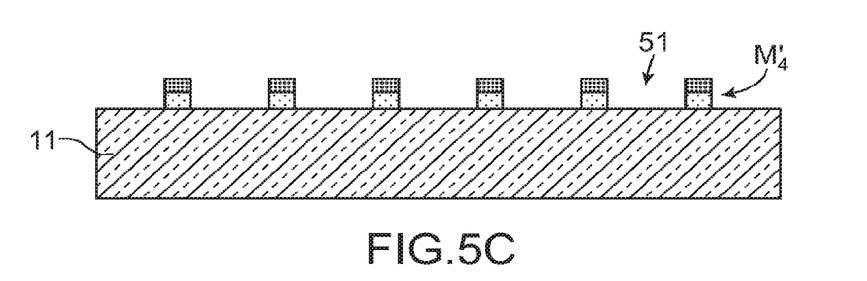

The semiconductor layer is then selectively removed with respect to the material 39 (for example SiN) of the second mask 40 (FIG. 5B). This selecting etching can take place, for example, by reactive-ion etching (RIE), by using, for example, a chlorinated gas such as $BCl_3$ or $SiCl_4$.

The supporting insulating layer 12 is then etched (FIG. 5C) through the apertures 51, so as to form patterns $M'_4$ in the insulating layer 12. Said etching can take place, for example, using RIE reactive-ion etching, for example by using a fluorinated gas such as $CHF_3$.

Then, the semiconductor supporting layer 11 can be etched (FIG. 5D) through the second mask 40, if selective etching exists and/or through the mask formed by the patterns $M'_4$ formed in the insulating layer, so as to produce patterns $M''_4$ in this layer 11 reproducing those of the second mask 40. This etching can take place, for example, by reactive-ion etching (RIE), for example using a chlorinated gas such as $BCl_3$ or $SiCl_4$.

Figure 5D:
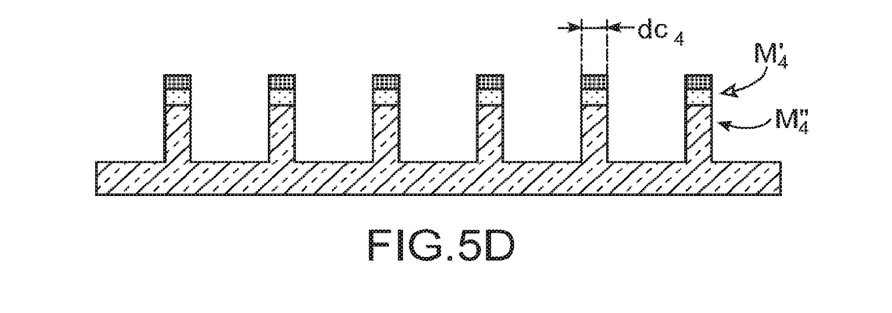

The patterns $M'_4$, $M''_4$ made therefore have a critical dimension $dc_4$, corresponding to that of the holes 133 previously formed by the removal of amorphous regions of the semiconductor layer, that is less than the dimensions that can be obtained using a standard lithographic method.

The patterns $M''_4$ can, for example, be intended to form structures of FinFET-type transistor channels, or, for example, emitting pillars of a light radiation-emitting device, or, for example, patterns of an embossing mould. Alternatively, the patterns $M''_4$ can be intended to define channels of a fluidic device.

Depending on the geometry of the implantation mask 20, patterns of various shapes and various sizes can be implemented in the semiconductor layer 13 using a method as described hereinabove.

Figure 6A:
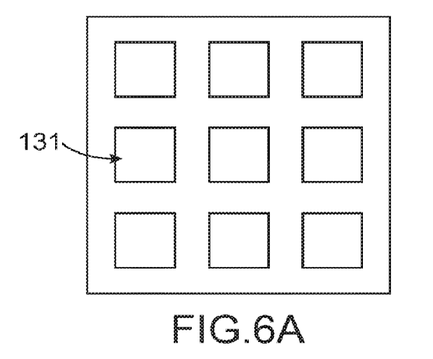
FIGS. 6A-6C and 7A-7C illustrate the production of patterns with different geometries by amorphisation then lateral recrystallisation of a material.
Figure 7A:
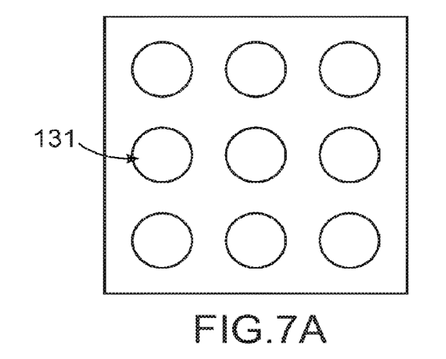

FIG. 6A illustrates one example embodiment wherein the mask used for the amorphisation has a rectangular or square shape, which results in the implementation of blocks 131 having a rectangular or square shape, whereas FIG. 7A illustrates one example embodiment wherein the mask used for the amorphisation step is disc-shaped, which results in the implementation of blocks 131 having a disc shape.

Figure 6B:
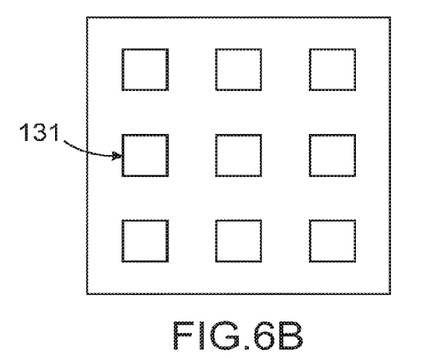
Figure 7B:
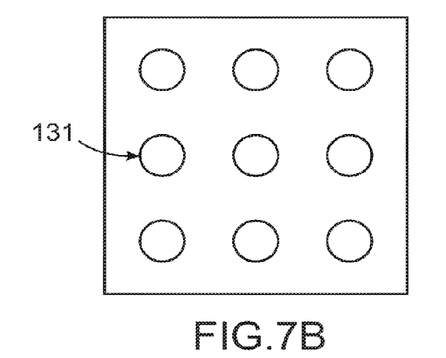

After amorphisation, recrystallisation is carried out by annealing so as to reduce the size of the amorphous blocks 131 (FIGS. 6B and 7B).

Figure 6C:
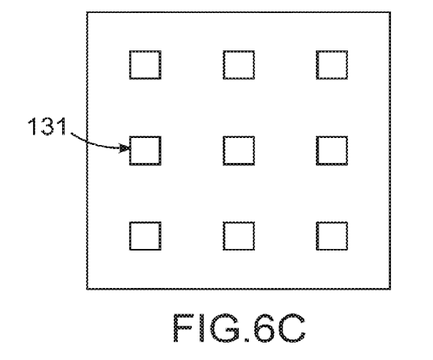
Figure 7C:
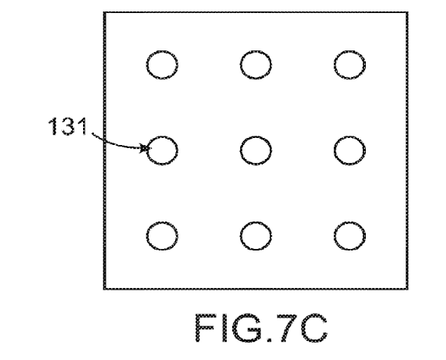

If the size of the amorphous blocks is to be further reduced, the recrystallisation annealing process can be prolonged (FIGS. 6C and 7C).

The advantage of the method is thus to be able to obtain patterns of different sizes (6A-6C, 7A-7C) that gradually get smaller, using a single initial mask 20, by simple control of the parameters of the recrystallisation annealing process, for example, only the annealing time at a constant annealing temperature.

A method according to the invention can also allow for the production of frame-shaped patterns, for example a crown or a ring, or patterns having a rectangular or square shape.

A method according to the invention can potentially be used to increase the size of a crystalline semiconductor area, by performing recrystallisation by annealing a region peripheral to this area, after amorphisation.

Figure 8A:
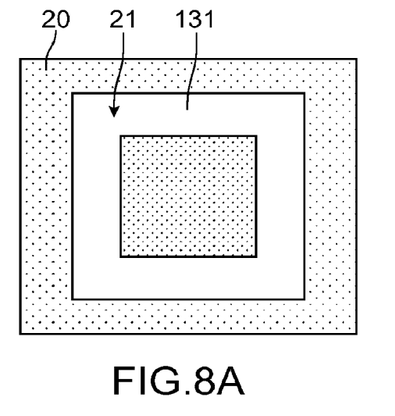
FIGS. 8A-8C and 9 illustrate the production of a pattern in the shape of a frame by amorphisation then lateral recrystallisation of a material.
Figure 8B:
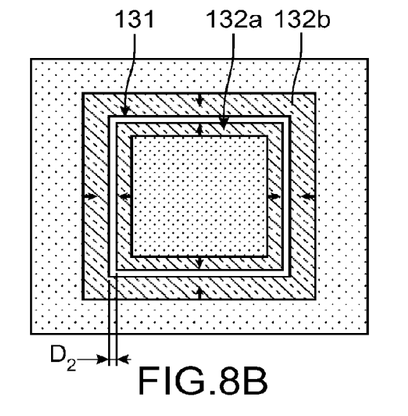
Figure 8C:
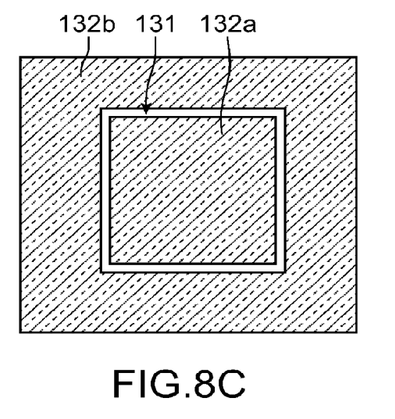

One specific embodiment of a rectangular frame-shaped pattern is illustrated in FIGS. 8A-8C.

To do this, a method is implemented as described hereinabove with reference to FIGS. 1A-1D, by firstly amorphising the upper crystalline layer through an aperture 21 in the mask 20, itself having a rectangular frame shape (FIG. 8A). An area 131 of material made amorphous is thus produced, forming a frame surrounding a first central region 132a of crystalline material, the amorphous area 131 itself being surrounded by a second peripheral region 132b of crystalline material.

Lateral recrystallisation annealing is then carried out so as to reduce the area 131 in the respective directions of propagation of the recrystallisation fronts (indicated by arrows in FIG. 8B). Recrystallisation takes place until an amorphous, frame-shaped area 131 having the desired critical dimension $D_2$ is obtained. The first central region 132a and the second peripheral region 132b of crystalline material are therefore extended simultaneously.

The mask 20 can then be removed (FIG. 8C).

Such an alternative method produces shapes that cannot be obtained by standard lithography.

Figure 9:
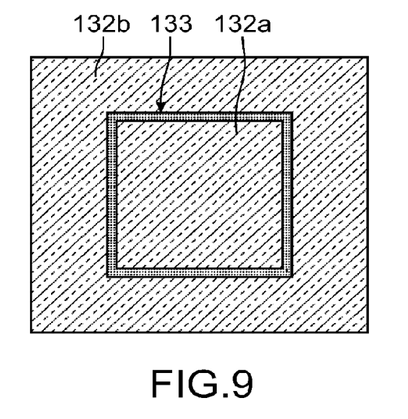

The amorphous area 131 can then be selectively etched with respect to the crystalline regions 132a, 132b or recrystallisation fronts to produce a frame-shaped hole 133 (FIG. 9).

This hole 133 can then potentially be filled with another material in order to produce a frame-shaped pattern having a critical dimension $dc_2$ in this other material.

The hole 133 can, for example, be filled with a dielectric material in order to form an insulating structure, for example of the STI type, surrounding a micro-electronic device. Alternatively, the hole 133 can, for example, be intended to form a cavity for an MEMS device (microelectromechanical system).

The invention claimed is:

1. A method for producing at least one pattern in a layer lying on a substrate, comprising:
    performing at least one ion implantation to make amorphous at least one first block of an upper layer of crystalline material, while a second block of the upper layer is protected by a first implantation mask, a crystalline structure of the second block of the upper layer that adjoins and is juxtaposed with the first block being preserved, the upper layer lying on a first supporting layer made of an amorphous material, the amorphous material allowing for selective etching with respect to an amorphous phase of the crystalline material;
    partially recrystallizing the first block by heat treatment, by using at least one side surface of the second block that is in contact with the first block as an area for a start of a recrystallization front, the partial recrystallization being carried out to preserve a region of amorphous material in the first block and by keeping the first supporting layer amorphous;
    selectively etching the amorphous material of the upper layer with respect to the crystalline material of the upper layer to form at least one first pattern in the upper layer, the region of etched amorphous material forming a hole through the upper layer, the hole having a reduced critical dimension with respect to a critical dimension of the first mask.

2. The method according to claim 1, further comprising, after selectively etching the amorphous material, filling the hole to form a second mask.

3. The method according to claim 1, wherein the etching of the amorphous material is carried out such that, at an end of the etching, the second block and a recrystallized portion of the first block are preserved, while an area of the first ion implantation mask is preserved on the second block,
    the method further comprising, after selectively etching the amorphous material:
    forming a second mask, the second mask being an implantation mask, the second mask filling the hole and complementing the first mask, the second mask covering the recrystallized portion of the first block;
    removing the first implantation mask to reveal the second block;
    making the second block amorphous while preserving the crystalline structure of the material of the recrystallized portion of the first block.

4. The method according to claim 3, wherein the second block is made amorphous by ion implantation through an aperture of the second implantation mask.

5. The method according to claim 4, further comprising, after amorphization of the second block: selectively etching the amorphous material of the upper layer with respect to the crystalline material of the upper layer, so as to remove the second block and form at least one second pattern in the upper layer, having a smaller size compared to the first pattern.

6. The method according to claim 3, further comprising, after making the second block amorphous:
    partially recrystallizing the second block by annealing, by using at least one side surface of the recrystallized portion of the first block as an area for start of a recrystallization front, while keeping the first supporting layer amorphous;

selectively removing the amorphous material with respect to the crystalline material, to form at least one other pattern having a smaller size compared to the first pattern, in the layer.

7. The method according to claim 6, further comprising: removing the second mask.

8. The method according to claim 7, further comprising, after having removed the second mask:

reproducing the other pattern in the first supporting layer.

9. The method according to claim 1, further comprising, after selectively etching the amorphous material of the upper layer:

removing the first mask;

reproducing the first pattern in the first supporting layer.

10. The method according to claim 9, wherein the first supporting layer lies on a second supporting layer, the method further comprising:

reproducing the first pattern in the second supporting layer.

11. The method according to claim 1, further comprising: one or more operations of reproducing the hole in the first supporting layer, or in the first supporting layer and a second supporting layer on which lies the first supporting layer.

12. The method according to claim 1, wherein the selective etching of the amorphous material is done with respect to the crystalline material and results in formation of at least one hole through the upper layer, the method further comprising:

filling the hole using at least one given material;

selectively etching the upper layer with respect to the given material.

13. The method according to claim 12, wherein the hole filled with the given material forms an area of an etching mask producing a given pattern, the method further comprising:

reproducing the given pattern in the first supporting layer.

14. The method according to claim 1, wherein the upper layer is a semiconductor surface layer of a substrate of semi-conductor on insulator, the first supporting layer being an insulating layer of the substrate lying on a second semiconductor supporting layer.

15. The method according to claim 1, wherein the at least one ion implantation is carried out by ion implantation through at least one aperture in a mask, to form a first amorphous block according to a first closed geometry, the partial recrystallization taking place to preserve the region of amorphous material of a geometry similar to the first geometry, having different dimensions in the first block.

16. The method according to claim 1, wherein the selectively etching the amorphous material further comprises selective etching with respect to the amorphous material of the first supporting layer.

17. The method according to claim 1, wherein temperature and duration of the heat treatment are chosen to modulate dimensions of the region of amorphous material preserved in the first block.

* * * * *